(12) United States Patent
Saruwatari et al.

(10) Patent No.: US 7,155,251 B2
(45) Date of Patent: Dec. 26, 2006

(54) MOBILE RADIO APPARATUS AND RADIO UNIT

(75) Inventors: Eiji Saruwatari, Hino (JP); Hideki Aisaka, Hino (JP)

(73) Assignee: Kabushiki Kaisha Toshiba (JP)

( * ) Notice: Subject to any disclaimer, the term of this patent is extended or adjusted under 35 U.S.C. 154(b) by 443 days.

(21) Appl. No.: 10/372,863

(22) Filed: Feb. 26, 2003

(65) Prior Publication Data
US 2003/0162513 A1 Aug. 28, 2003

(30) Foreign Application Priority Data
Feb. 26, 2002 (JP) ............................. 2002-050018

(51) Int. Cl.
H04B 1/38 (2006.01)
H04B 1/02 (2006.01)
H04M 1/00 (2006.01)

(52) U.S. Cl. ................ 455/552.1; 455/103; 455/127.3; 455/127.4

(58) Field of Classification Search ............ 455/550.1, 455/552.1, 127.1, 127.2, 127.3, 127.5, 103, 455/127.4; 330/285, 295, 296
See application file for complete search history.

(56) References Cited

U.S. PATENT DOCUMENTS

| 5,796,306 A * | 8/1998 | Tsumura .................. 330/124 R |
| 6,137,355 A * | 10/2000 | Sevic et al. ................... 330/51 |
| 6,297,694 B1 * | 10/2001 | Yamamoto .................... 330/51 |
| 6,532,357 B1 * | 3/2003 | Ichikawa ..................... 455/126 |

FOREIGN PATENT DOCUMENTS

| JP | 08-149036 A | 6/1996 |
| JP | 11-186921 | 7/1999 |
| JP | 2000-232381 A | 8/2000 |
| JP | 2001-007657 | 1/2001 |

* cited by examiner

Primary Examiner—Nguyen T. Vo
(74) Attorney, Agent, or Firm—Banner & Witcoff, Ltd.

(57) ABSTRACT

A plurality of amplifiers corresponding to a plurality of types of transmitting signals are provided to amplify the transmitting signals to a power level at which they can be transmitted by radio. The amplifiers are driven by both power and a bias. The bias is supplied to one of the amplifiers that amplifies a to-be-transmitted transmitting signal.

6 Claims, 2 Drawing Sheets

MOBILE RADIO APPARATUS AND RADIO UNIT

CROSS-REFERENCE TO RELATED APPLICATIONS

This application is based upon and claims the benefit of priority from the prior Japanese Patent Application No. 2002-50018, filed Feb. 26, 2002, the entire contents of which are incorporated herein by reference.

BACKGROUND OF THE INVENTION

1. Field of the Invention

The present invention relates to a mobile radio apparatus, such as a multi-mode portable communication terminal, for transmitting various types of radio signals and also relates to a radio unit in the mobile radio apparatus.

2. Description of the Related Art

Various communication systems, such as PCS (Personal Communication Services), the cellular system, AMPS (Advanced Mobile Phone Services), etc., generally use radio channels of different frequency bands.

Accordingly, multi-mode portable communication terminals need to transmit radio signals of different frequency bands. More specifically, a portable communication terminal compatible with two communication modes needs to transmit first and second communication mode radio signals of different frequency bands separately as shown in FIG. 3.

FIG. 4 is a block diagram illustrating the structure of a radio unit incorporated in a conventional dual-mode portable communication terminal.

As seen in the figure, the conventional portable communication terminal comprises power amplifiers 1 and 2, duplexers (DUP) 3 and 4, diplexer (DIP) 5, antenna 6, switching circuits 7 and 8, control section 9 and bias generating section 10.

The first transmitting signal for the first communication mode is amplified by the power amplifier 1, and then guided to the antenna 6 via the duplexer 3 and diplexer 5. Similarly, the second transmitting signal for the second communication mode is amplified by the power amplifier 2, and then guided to the antenna 6 via the duplexer 4 and diplexer 5. From the antenna 6, the first or second transmitting signal is transmitted by radio.

The two different communication modes are not simultaneously used; therefore the power amplifiers 1 and 2 do not need to simultaneously operate. This being so, the supply of power to the power amplifiers 1 and 2 is controlled by the switching circuits 7 and 8, respectively. The ON/OFF of the switching circuits 7 and 8 is controlled by the control section 9 so that only one of the power amplifiers that corresponds to the signal to be transmitted will operate.

When the power amplifiers 1 and 2 operate, they need a bias. This bias is generated by a bias generating section 10. Only when one of the power amplifiers 1 and 2 needs to operate, the bias generating section 10 generates a bias under the control of the control section 9.

In a conventional portable communication terminal having a plurality of power amplifiers as described above, respective switching circuits are provided to enable the power amplifiers to be turned on and off individually. This structure is employed to minimize the power supplied to the power amplifiers so as to suppress the current consumption.

To enable the power amplifiers to produce a large gain, a very large current needs to be supplied thereto. Switching circuits for turning on/off such large-current amplifiers therefore need a large capacity. Since the same number of large-capacity switching circuits as the number of communication modes is necessary, an extremely large space is needed to mount the circuits.

BRIEF SUMMARY OF THE INVENTION

The present invention has been developed in light of the above, and aims to reduce the size of components mounted in a mobile radio apparatus, and hence reduce the size of the mobile radio apparatus itself.

According to an aspect of the invention, there is provided a mobile radio apparatus for transmitting a plurality of types of transmitting signals by radio, comprising: a plurality of amplifiers driven by power and a bias, and configured to amplify the plurality of types of transmitting signals to a power level at which the transmitting signals can be transmitted by radio; a bias supply unit configured to supply the bias to the amplifiers; and a control unit configured to control the bias supply unit to supply the bias to one of the amplifiers, the one of the amplifiers amplifying a transmitting signal to be transmitted.

According to another aspect of the present invention, there is provided a radio unit comprising: a plurality of amplifiers driven by power and a bias, configured to amplify each of the radio transmitting signals to each power level to be transmitted; a bias supply unit configured to supply the bias to the amplifiers; and a control unit configured to control the bias supply unit to supply the bias to one of the amplifiers, the one of the amplifiers amplifying a radio transmitting signal to be transmitted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the invention will be described with reference to the accompanying drawings.

Figure 1:
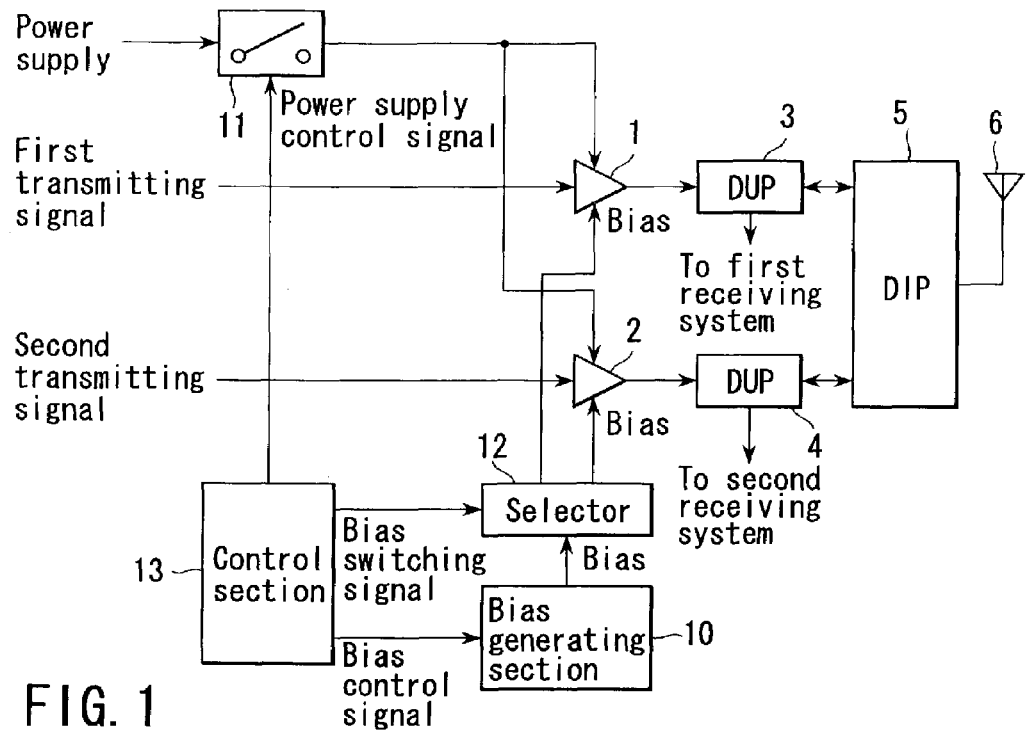
FIG. 1 is a block diagram illustrating the structure of a radio unit incorporated in a portable communication terminal according to an embodiment of the invention.
Figure 4:
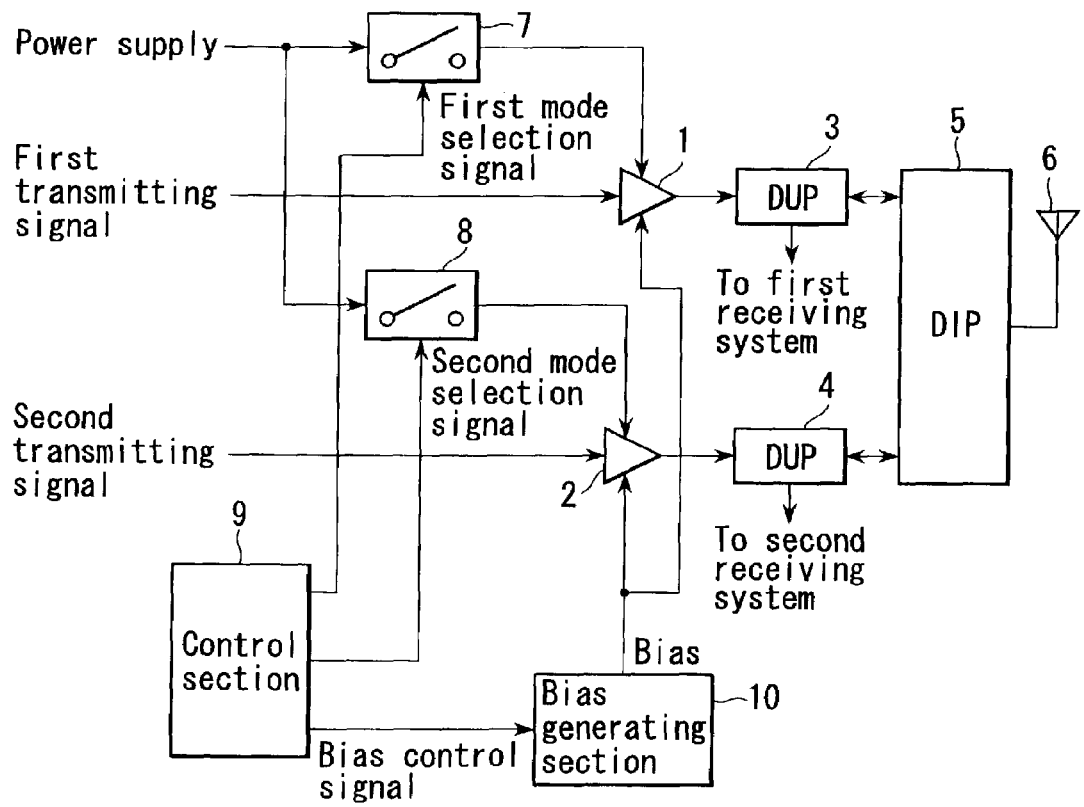
FIG. 4 is a block diagram illustrating the structure of a radio unit incorporated in a conventional dual-mode portable communication terminal.

FIG. 1 is a block diagram illustrating the structure of a radio unit incorporated in a portable communication terminal according to the embodiment of the invention. In FIG. 1, the same elements as those in FIG. 4 are denoted by corresponding reference numerals.

As described in FIG. 1, the portable communication terminal of the embodiment comprises power amplifiers 1 and 2, duplexers (DUP) 3 and 4, diplexer (DIP) 5, an antenna 6, a bias generating circuit 10, a switching circuit 11, a selector 12 and a control section 13.

When the terminal assumes the first communication mode, a first radio transmitting signal is supplied to the power amplifier 1 from a signal processing section (not shown). The first radio transmitting signal has a signal format corresponding to the first communication mode, and a frequency that falls within the frequency band used in the first communication mode.

The power amplifier 1 is driven by power supplied via the switching circuit 11 and a bias supplied from the bias generating circuit 10 via the selector 12. The power amplifier 1 amplifies the first transmitting signal to a power level to be transmitted by radio from the antenna 6, and outputs the amplified first transmitting signal to the duplexer 3.

When the terminal assumes the second communication mode, a second transmitting signal is supplied to the power amplifier 2 from a signal processing section (not shown). The second transmitting signal has a signal format corresponding to the second communication mode, and a frequency that falls within the frequency band used in the second communication mode.

The power amplifier 2 is driven by the power supplied via the switching circuit 11 and the bias supplied from the bias generating circuit 10 via the selector 12. The power amplifier 2 amplifies the second transmitting signal to a power level to be transmitted by radio from the antenna 6, and outputs the amplified second transmitting signal to the duplexer 4.

The duplexers 3 and 4 supply the diplexer 5 with the transmitting signals output from the power amplifiers 1 and 2, respectively. The diplexer 5 supplies a received signal to the duplexers 3 and 4. The duplexers 3 and 4 supply the received signal to a first or second receiving system.

The diplexer 5 supplies the antenna 6 with the transmitting signals output from the duplexers 3 and 4. Further, the diplexer 5 extracts, from a signal received by the antenna 6, a component of a frequency band corresponding to the first communication mode, the component serving as a first receiving signal. Further, the diplexer 5 extracts, from a signal received by the antenna 6, a component of a frequency band corresponding to the second communication mode, the component serving as a second receiving signal. After that, the diplexer 5 outputs the first and second receiving signals to the duplexers 3 and 4, respectively.

The antenna 6 transmits, by radio, the transmitting signals supplied from the diplexer 5. Further, the antenna 6 generates a receiving signal corresponding to radiowave received, and outputs the signal to the diplexer 5.

The bias generating circuit 10 generates a bias for operating the power amplifiers 1 and 2. This bias is much smaller than the power supplied to the power amplifiers 1 and 2, and is supplied to the selector 12. The bias generating section 10 generates a bias only when the bias control signal output from the control section 13 is at the high level.

The switching circuit 11 executes ON/OFF control of the supply of power to the power amplifiers 1 and 2 in accordance with the power control signal output from the control section 13. The switching circuit 11 may be formed of a device similar to the switching circuit 7 or 8 shown in FIG. 4. However, the switching circuit 11 has a role different from that of the switching circuit 7 or 8. The main role of the switching circuit 11 is not to turn on/off the power amplifiers 1 and 2, but to prevent leakage, to the power amplifiers 1 and 2, of overcurrent that may occur, for example, when a power supply circuit (not shown) starts to operate.

The selector 12 selectively supplies the power amplifiers 1 and 2 with a bias generated by the bias generating circuit 10. The selector 12 selects the power amplifiers 1 or 2 in accordance with a bias-switching signal output from the control section 13.

The control section 13 outputs a power supply control signal, bias control signal or bias-switching signal in accordance with the communication state of the telephone terminal, thereby controlling the operation of the power amplifiers 1 and 2.

A description will now be given of the operation of the portable communication terminal constructed as the above.

Figure 2:
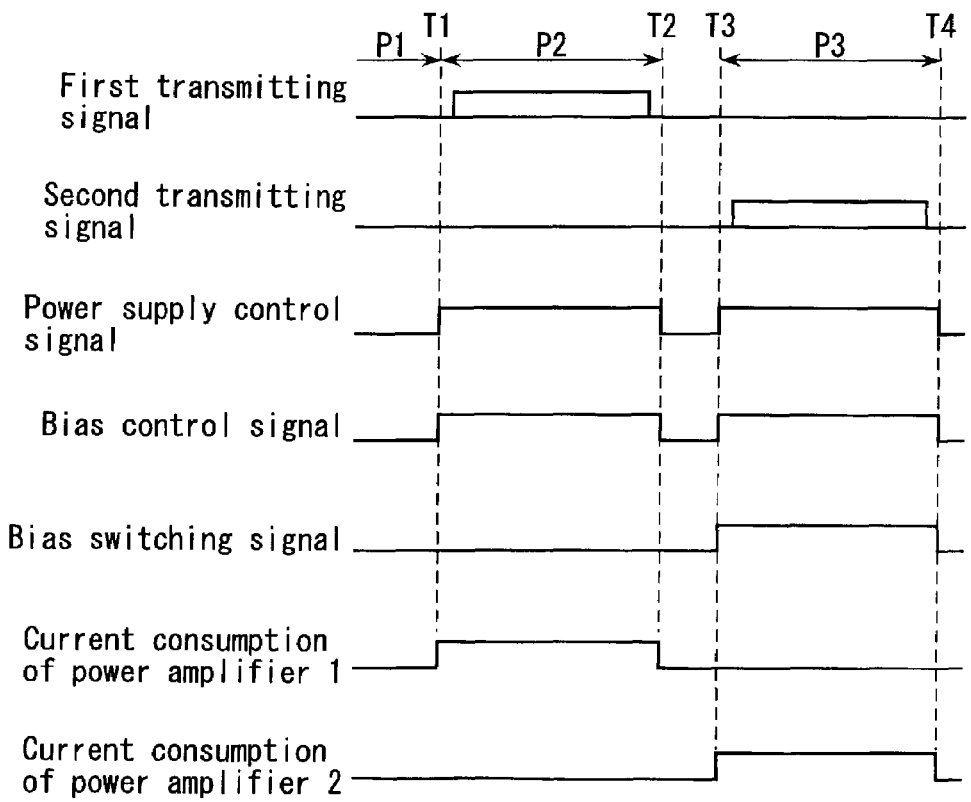
FIG. 2 is a timing chart illustrating points in time at which the control section shown in FIG. 1 changes a power supply control signal, bias control signal and bias-switching signal.
Figure 3:
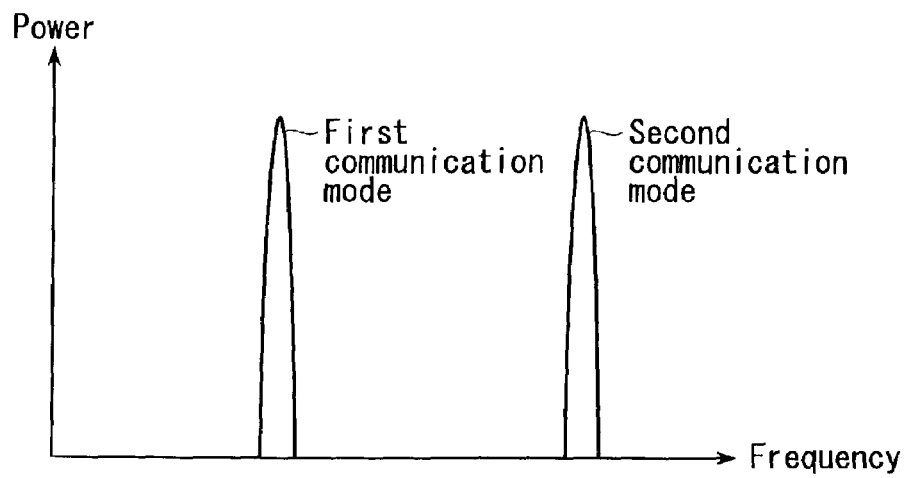
FIG. 3 is a view illustrating spectral examples of radio transmitting signals of two communication modes to be processed by a dual-mode portable communication terminal.

When the terminal does not execute communication, the control section 13 sets the power supply control signal and bias control signal at the low level, as in the period P1 shown in FIG. 2. At this time, since the power supply control signal is at the low level, the switching circuit 11 is in the OFF state; therefore no power is supplied to the power amplifiers 1 and 2. Accordingly, the power amplifier 1 or 2 does not operate, and therefore does not consume a current.

If the control section 13 needs to change the above-mentioned state to the first communication mode, it shifts the power supply control signal and bias control signal to the high level at the time point T1 shown in FIG. 2. The bias-switching signal is normally set at the low level. At this time, the control section 13 maintains the bias switching signal at the low level.

During the period P2 of FIG. 2 in which the signals assume the above-mentioned levels, the switching circuit 11 is in the ON state, thereby supplying power to the power amplifiers 1 and 2. Further, the bias generating circuit 10 starts to generate a bias. At this time, since the bias-switching signal is at the low level, the selector 12 supplies the bias to the power amplifier 1. Thus, both the power supply and bias generating section 10 supply the bias to the power amplifier 1, with the result that the power amplifier 1 becomes operable. In this state, if a first signal is supplied to the power amplifier 1, it is amplified by the power amplifier 1. The amplified first signal is output from the power amplifier 1 to the antenna 6 via the duplexer 3 and diplexer 5. From the antenna 6, the first signal is transmitted by radio.

On the other hand, during the time period P2, no bias is applied to the power amplifier 2. Therefore, although power is supplied from the power supply to the power amplifier 2, the power amplifier 2 does not operate and hence consumes no current.

After the first communication mode is finished, the control section 13 returns the power supply control signal and bias control signal to the low level at the time point T2 of FIG. 2. The control section 13 maintains the bias-switching signal at the low level. Thus, the telephone terminal is returned to the state assumed during the time period P1, where the power amplifiers 1 and 2 consume no current.

If the control section 13 needs to start the second communication mode, it shifts the power supply control signal and bias control signal to the high level at the time point T3 of FIG. 2. At this time, the control section 13 also shifts the bias switching signal to the high level.

During the period P3 of FIG. 2 in which the signals assume the above-mentioned levels, the switching circuit 11 is in the ON state, thereby supplying power to the power amplifiers 1 and 2. Further, the bias generating circuit 10 starts to generate a bias. At this time, since the bias-switching signal is at the high level, the selector 12 supplies the bias to the power amplifier 2. Thus, both the power supply and bias generating section 10 supply power to the power amplifier 2, with the result that the power amplifier 2 becomes operable. In this state, if a second signal is supplied to the power amplifier 2, it is amplified by the power amplifier 2. The amplified second signal is output from the power amplifier 2 to the antenna 6 via the duplexer 4 and diplexer 5. From the antenna 6, the second signal is transmitted by radio.

On the other hand, during the time period P3, no bias is applied to the power amplifier 1. Therefore, although power is supplied from the power supply to the power amplifier 1, the power amplifier 1 does not operate and hence consumes no current.

After the second communication mode is finished, the control section 13 returns the power supply control signal, bias control signal and bias switching signal to the low level at the time point T4 of FIG. 2. Thus, the telephone terminal is returned to the state assumed during the time period P1, where the power amplifiers 1 and 2 consume no current.

As described above, in the embodiment, power is supplied to both the power amplifiers 1 and 2. And only one of the power amplifiers 1 and 2 is operated by selectively applying a bias thereto. This structure does not require a switching circuit for executing ON/OFF control of the supply of a power supply current to each of the power amplifiers 1 and 2. Instead of the switching circuit, the selector 12 is necessary. However, the bias to be output from the selector 12 is much smaller than the power supply current, therefore the selector 12 can be realized by a much smaller device than the switching circuit for performing ON/OFF control of the supply of the power supply current. Accordingly, the space for mounting the device can be significantly reduced.

The power amplifiers 1 and 2 do not operate unless no bias is applied thereto. However, some types of devices may consume a very small amount of current if a power supply current is supplied thereto. In light of this, the embodiment employs the switching circuit 11 for interrupting the supply of power to the power amplifiers 1 and 2 if both the amplifiers do not have to operate. This prevents the power amplifiers 1 and 2 from consuming a current in a non-communication state, thereby further reducing the current consumption.

The invention is not limited to the above embodiment. For example, the invention is also applicable to a terminal capable of three or more types of transmitting signals.

All or some of transmitting signals may have the same frequency band.

Respective bias generating sections may be provided for the power amplifiers, and be selectively operated.

The invention is also applicable to mobile radio apparatus different from portable communication terminal.

If there is no danger of overcurrent flowing to the power amplifiers 1 and 2 when, for example, the power supply circuit starts to operate, the switching circuit 11 is not necessary.

This invention applies to a mobile radio apparatus and a radio unit in a mobile radio apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mobile radio apparatus which transmits a first radio transmitting signal or a second radio transmitting signal, the mobile radio apparatus comprising:
  a first amplifier driven by a power signal and a bias signal separate from the power signal, the first amplifier configured to amplify the first radio transmitting signals to a power level for transmission;
  a second amplifier driven by the power signal and the bias-signal, the second amplifier configured to amplify the second radio transmitting signal to a power level for transmission;
  a switching circuit configured to turn ON/OFF the power supplied to the first and second amplifiers;
  a bias supply unit configured to supply the bias to selectively one of the first and second amplifiers; and
  a control unit configured to control the bias supply unit to supply the bias to the first amplifier and to control the switching circuit to turn ON the power supplied to the first and second amplifiers, when the first radio transmitting signal is to be transmitted, and to control the bias supply unit to supply the bias to the second amplifier and to control the switching circuit to turn ON the power supplied to the first and second amplifiers, when the second radio transmitting signal is to be transmitted.

2. The mobile radio apparatus according to claim 1, wherein the first and second radio transmitting signals are associated with a frequency band.

3. The mobile radio apparatus according to claim 1, further comprising an antenna unit configured to transmit each of the amplified first and second radio transmitting signals.

4. A radio unit in a mobile radio apparatus, the radio unit comprising:
  a first amplifier driven by a power signal and a first bias signal separate from the power signal, the first amplifier configured to amplify the first radio transmitting signal to a power level for transmission;
  a second amplifier driven by the power signal and a second bias signal separate from the power signal, the second amplifier configured to amplify the second radio transmitting signal to a power level for transmission;
  a switching circuit configured to turn ON/OFF the power supplied to the first and second amplifiers;
  a bias supply unit configured to supply the bias to selectively one of the first and second amplifiers; and
  a control unit configured to control the bias supply unit to supply the bias to the first amplifier and to control the switching circuit to turn ON the power supplied to the first and second amplifiers, when the first radio transmitting signal is to be transmitted, and to control the bias supply unit to supply the bias to the second amplifier and to control the switching circuit to turn ON the power supplied to the first and second amplifiers, when the second radio transmitting signal is to be transmitted.

5. The radio unit according to claim 4, wherein the first and second radio transmitting signals are associated with a frequency band.

6. The radio unit according to claim 4, wherein each of the amplified first and second radio transmitting signals is transmitted by an antenna unit.

* * * * *